(12) United States Patent
Ni et al.

(10) Patent No.: US 8,564,123 B2
(45) Date of Patent: Oct. 22, 2013

(54) CHIP PACKAGE AND FABRICATION METHOD THEREOF

(76) Inventors: Ching-Yu Ni, Hsinchu (TW); Chang-Sheng Hsu, Hsinchu (TW)

( * ) Notice: Subject to any disclaimer, the term of this patent is extended or adjusted under 35 U.S.C. 154(b) by 200 days.

(21) Appl. No.: 13/011,184

(22) Filed: Jan. 21, 2011

(65) Prior Publication Data
US 2011/0175221 A1    Jul. 21, 2011

Related U.S. Application Data

(60) Provisional application No. 61/297,246, filed on Jan. 21, 2010.

(51) Int. Cl.
H01L 23/10 (2006.01)
(52) U.S. Cl.
USPC .......................................... 257/710; 257/432
(58) Field of Classification Search
USPC .......... 257/710, 711, 787, 704, 431, 432, 433
See application file for complete search history.

(56) References Cited

U.S. PATENT DOCUMENTS

| | | | | |
|---|---|---|---|---|
| 7,936,062 | B2* | 5/2011 | Humpston et al. | 257/704 |
| 7,999,374 | B2* | 8/2011 | So et al. | 257/712 |
| 2012/0018729 | A1* | 1/2012 | Takayama et al. | 257/59 |
| 2012/0070919 | A1* | 3/2012 | Takayama et al. | 438/22 |
| 2012/0306038 | A1* | 12/2012 | Chow et al. | 257/434 |

* cited by examiner

Primary Examiner — S. V. Clark
(74) Attorney, Agent, or Firm — Liu & Liu

(57) ABSTRACT

A chip package and a fabrication method thereof are provided according to an embodiment of the invention. The chip package contains a semiconductor substrate having a chip. A packaging layer is disposed over the semiconductor substrate. A spacer is disposed between the semiconductor substrate and the packaging layer, wherein a side surface consisting of the semiconductor substrate, the spacer and the packaging layer has a recess section. The method includes forming a plurality of spacers between a plurality of chips of a semiconductor wafer and a packaging layer, wherein each spacer corresponding to each chip is separated from each other and the spacer is shrunk inward from an edge of the chip to form a recess section and dicing the semiconductor wafer along a scribe line between any two adjacent chips to form a plurality of chip packages.

15 Claims, 8 Drawing Sheets

CHIP PACKAGE AND FABRICATION METHOD THEREOF

CROSS REFERENCE TO RELATED APPLICATIONS

This application claims the benefit of U.S. Provisional Application No. 61/297,246, filed on Jan. 21, 2010, the entirety of which is incorporated by reference herein.

BACKGROUND OF THE INVENTION

1. Field of the Invention

The present invention relates to a chip package, and in particular relates to a spacer structure design of a chip package and a fabrication method thereof.

2. Description of the Related Art

Wafer level chip scale packaging technology has been developed for chip packages. In a wafer level chip scale package, a semiconductor wafer is bonded to a glass substrate and a spacer is disposed between the semiconductor wafer and the glass substrate. After the wafer level chip scale package is formed, a dicing process is performed between each chip to form a chip package.

In the conventional chip packages, a side surface consisting of the semiconductor wafer, the spacer and the glass substrate is continuous. Because the materials of the semiconductor wafer, the spacer and the glass substrate are different, thermal expansion coefficients thereof are also different. When the conventional chip packages are exposed to a high temperature, delamination occurs between the semiconductor wafer, the spacer and the glass substrate. Therefore, water vapor and air easily permeate into the conventional chip packages to produce electrical failure therein.

Therefore, a chip package which can overcome the above mentioned problems is desired to prevent chip packages from delamination.

BRIEF SUMMARY OF THE INVENTION

According to an illustrative embodiment, a chip package is provided. The chip package comprises a semiconductor substrate, having a chip. A packaging layer is disposed over the semiconductor substrate. A spacer is disposed between the semiconductor substrate and the packaging layer, wherein a side surface consisting of the semiconductor substrate, the spacer and the packaging layer has a recess section, and the recess section is located between the semiconductor substrate and the packaging layer, such that a non-continuous side surface is formed by the semiconductor substrate, the spacer and the packaging layer.

Moreover, according to another illustrative embodiment, a method for fabricating a chip package is provided. The method comprises providing a semiconductor wafer, containing a plurality of chip, wherein an area between any two adjacent chips comprises a scribe line. A packaging layer is provided and a plurality of spacers is formed between the chips of the semiconductor wafer and the packaging layer, wherein each the spacer corresponding to each chip is separated from each other and the spacer is shrunk inward from an edge of the chip to form a recess section. The semiconductor wafer and the packaging layer are bonded together and dicing the semiconductor wafer along the scribe line to form a plurality of chip packages.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
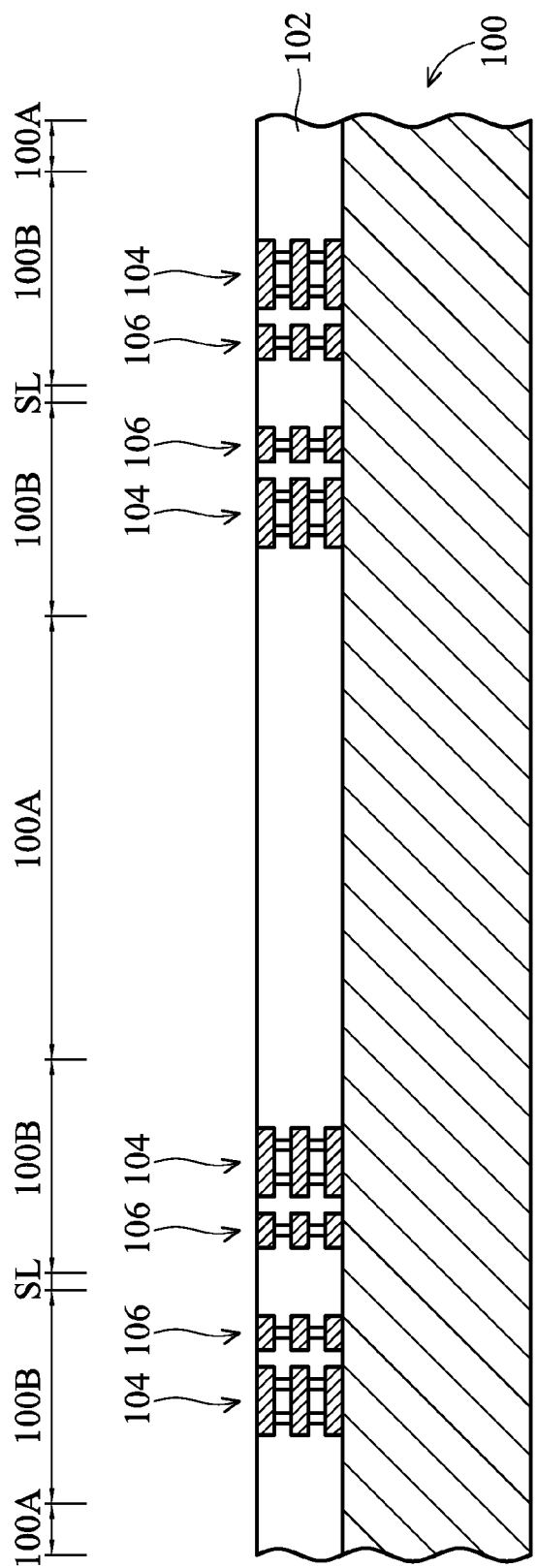
FIGS. 1A-1H are illustrative cross sections showing the steps for fabricating a chip package according to an embodiment of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts. In the drawings, the size of some of the elements may be exaggerated and not drawn to scale for illustrative purposes. The dimensions and the relative dimensions do not correspond to actual dimensions to practice of the invention. Further, parts of the elements in the drawings may be illustrated by the following description. Some elements not shown in the drawings are known by one skilled the art.

The embodiments of chip packages of the invention and fabrication methods thereof are illustrated by embodiments of fabricating image sensor chip packages. However, it should be appreciated that the invention may also be applied to forming other semiconductor chips. Therefore, the packages of the embodiments of the invention may be applied to active or passive components, or electronic components with digital or analog circuits, such as optoelectronic devices, micro electro mechanical systems (MEMS), micro fluidic systems, and physical sensors for detecting heat, light, or pressure. Particularly, a wafer level chip scale packaging (WLCSP) process may be applied to package semiconductor chips, such as image sensor devices, light-emitting diodes (LEDs), solar cells, RF circuits, accelerators, gyroscopes, micro actuators, surface acoustic wave devices, pressure sensors, and ink printer heads.

The wafer level chip scale packaging process herein mainly means that after the packaging process is completed during a wafer stage, a wafer with chips is cut to obtain separate independent packages. However, in an embodiment of the invention, separate independent chips may be redistributed overlying a supporting wafer and then be packaged, which may also be referred to as a wafer level chip scale packaging process. In addition, the wafer level chip scale packaging process may also be adapted to form chip packages of multi-layered integrated circuit devices by stacking a plurality of wafers having integrated circuits together.

An embodiment of the invention provides a chip package and a fabrication method thereof. After a wafer level chip scale package of the above mentioned devices is formed, each chip of the wafer is separated by a dicing process to form separate independent chip packages. In the embodiments of the chip packages of the invention, a side surface consisting of a semiconductor substrate, a spacer and a packaging layer has a recess section. In one embodiment, the recess section is located between the semiconductor substrate and the packaging layer, such that a non-continuous side surface is formed from the semiconductor substrate, the spacer and the packaging layer to prevent the chip packages from delamination.

Then, referring to FIGS. 1A-1H, cross sections illustrating the steps for fabricating a chip package according to an embodiment of the invention are shown. As shown in FIG. 1A, first, a semiconductor wafer 100, containing a plurality of chips, is provided. Each chip includes a device area 100A and a peripheral bonding pad area 100B, wherein the device area 100A is surrounded by the peripheral bonding pad area 100B.

Moreover, a plurality of conductive pads 104 and a plurality of seal rings 106 are disposed on the peripheral bonding pad areas 100B of the chips in the wafer 100. The conductive pad 104 and the seal ring 106 are formed from a plurality of metal layers and a plurality of vias. The conductive pads 104 and the seal rings 106 are formed in an intermetal dielectric layer (IMD) 102, wherein the conductive pads 104 are surrounded by the seal ring 106 and the device area 100A is also surrounded by the seal ring 106. A scribe line (SL), between any two adjacent chips, is defined between two adjacent seal rings 106.

Figure 1B:
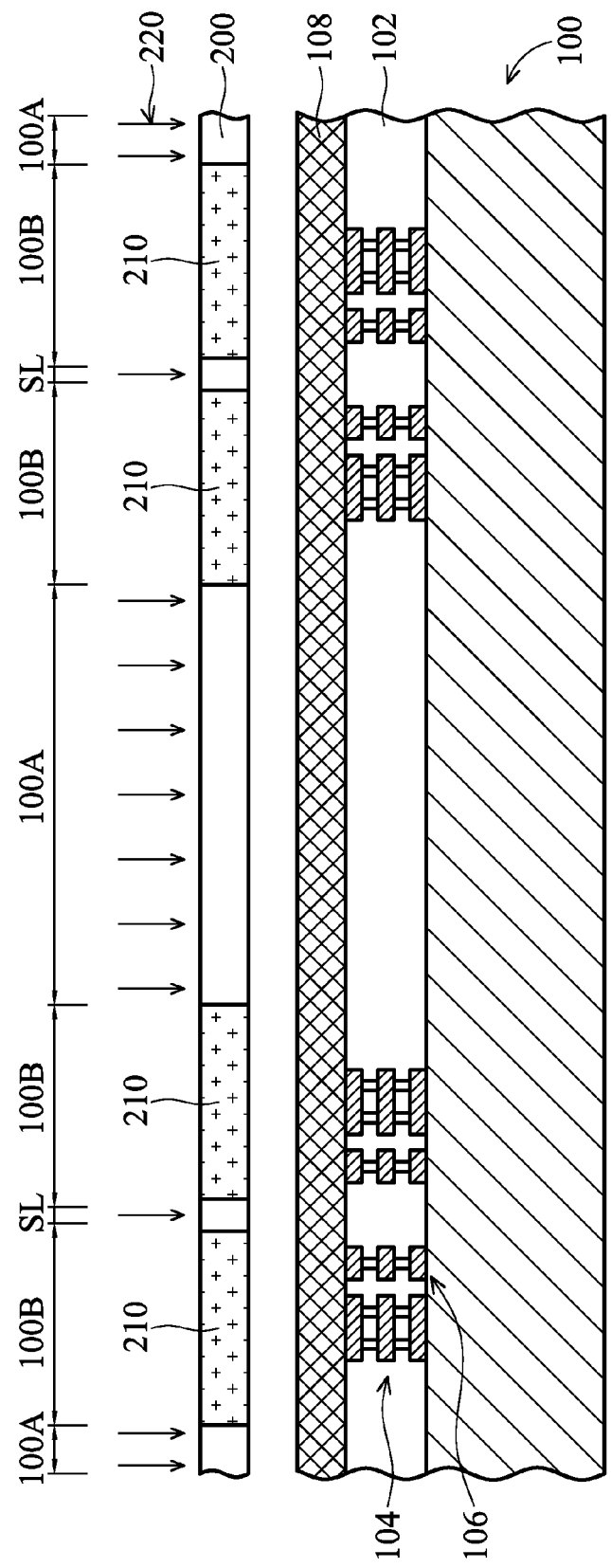

Next, referring to FIG. 1B, a spacer material layer 108 is formed on a surface of the semiconductor wafer 100. The spacer material layer 108 may be a photosensitive insulating material, such as epoxy resin, a solder mask, etc, which can be formed by a coating process. As shown in FIG. 1B, a photo mask 200 is disposed above the spacer material layer 108. The photo mask 200 has a photo mask pattern 210 corresponding to a predetermined spacer pattern.

Figure 1C:
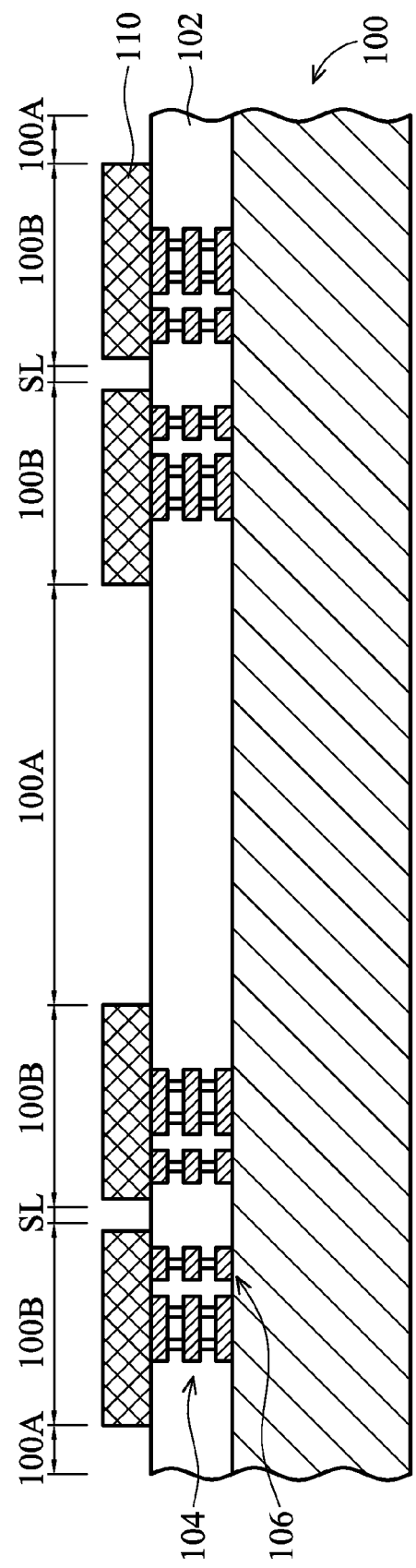

Then, an exposure process 220 and a development process are performed on the spacer material layer 108 to define a pattern of a spacer 110 to form a plurality of spacers 110 as shown in FIG. 1C. In an embodiment, the spacer 110 is formed on the peripheral bonding pad area 100B, surrounding the device area 100A. From a top view, each spacer 110 corresponding to each chip is separate from each other to form a non-continuous spacer pattern. The spacer 110 is shrunk inward from the edge of the chip, i.e. the boundary of the peripheral bonding pad area 100B, to form a recess section. Moreover, the seal ring 106 is disposed in the area of the spacer 110.

Figure 1D:
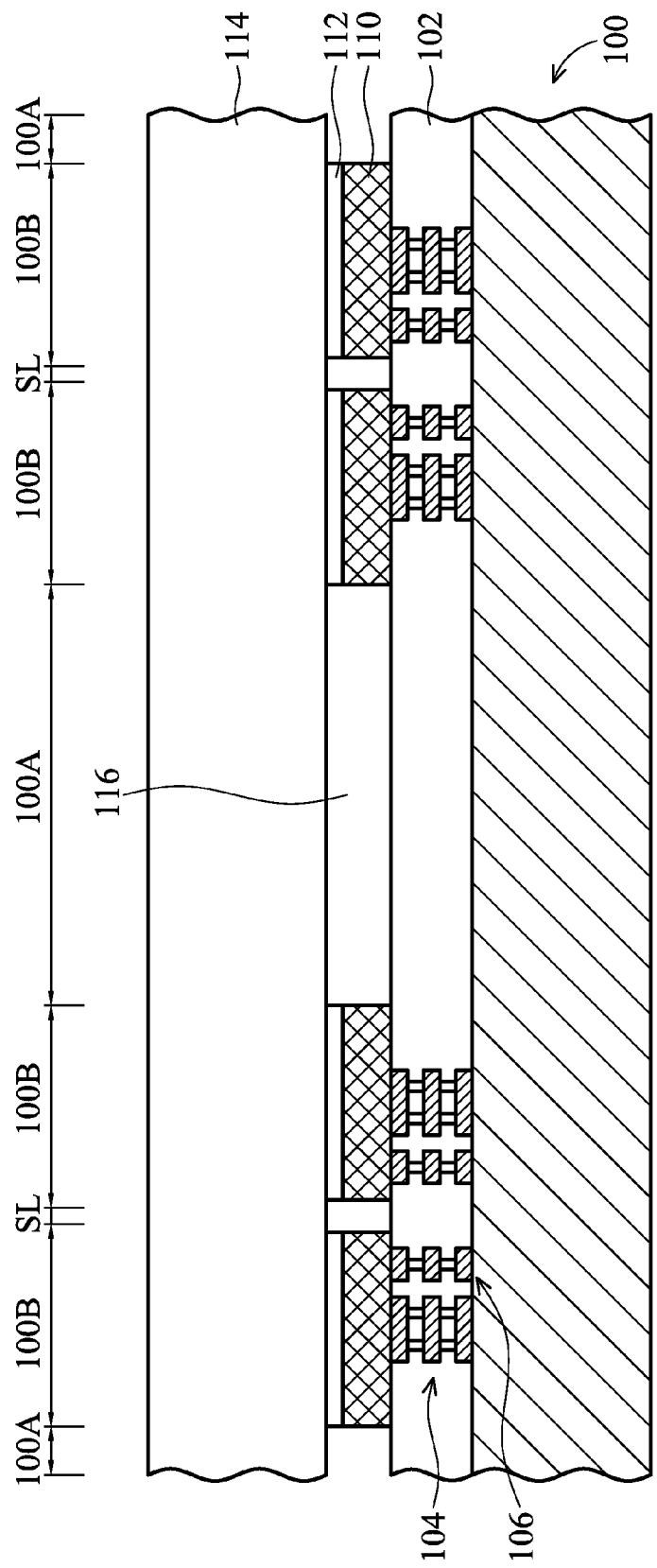

Next, as shown in FIG. 1D, a packaging layer 114 is provided to bond with the semiconductor wafer 100. The packaging layer 114 may be a glass plate or another silicon wafer. In an embodiment, the packaging layer 114 may be separated from the semiconductor wafer 100 by the spacer 110 and a cavity 116 surrounded by the spacer 110 is formed at the same time. In this embodiment, first, the spacer 110 is formed on the semiconductor wafer 100, and then the spacer 110 is bonded to the packaging layer 114 through an adhesive layer 112. In another embodiment, first, the spacer 110 is formed on the packaging layer 114, and then the spacer 110 is bonded to the semiconductor wafer 100 through an adhesive layer (not shown). In this embodiment, the adhesive layer is disposed between the spacer 110 and the semiconductor wafer 100.

The adhesive layer 112 can be coated on the spacer 110 by a screen printing process. A pattern of the adhesive layer 112 is substantially the same as the pattern of the spacer 110.

Figure 1E:
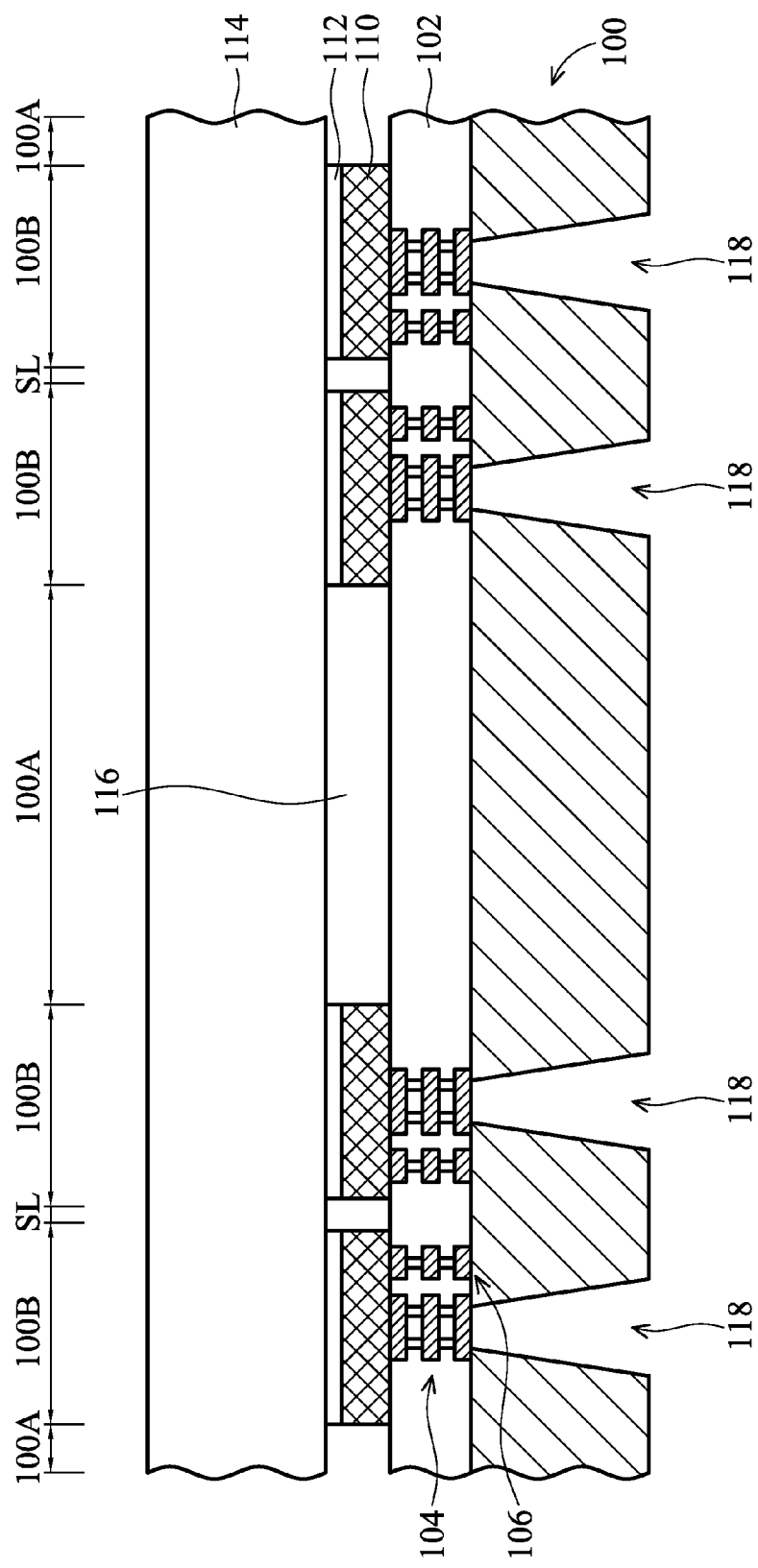
Figure 1F:
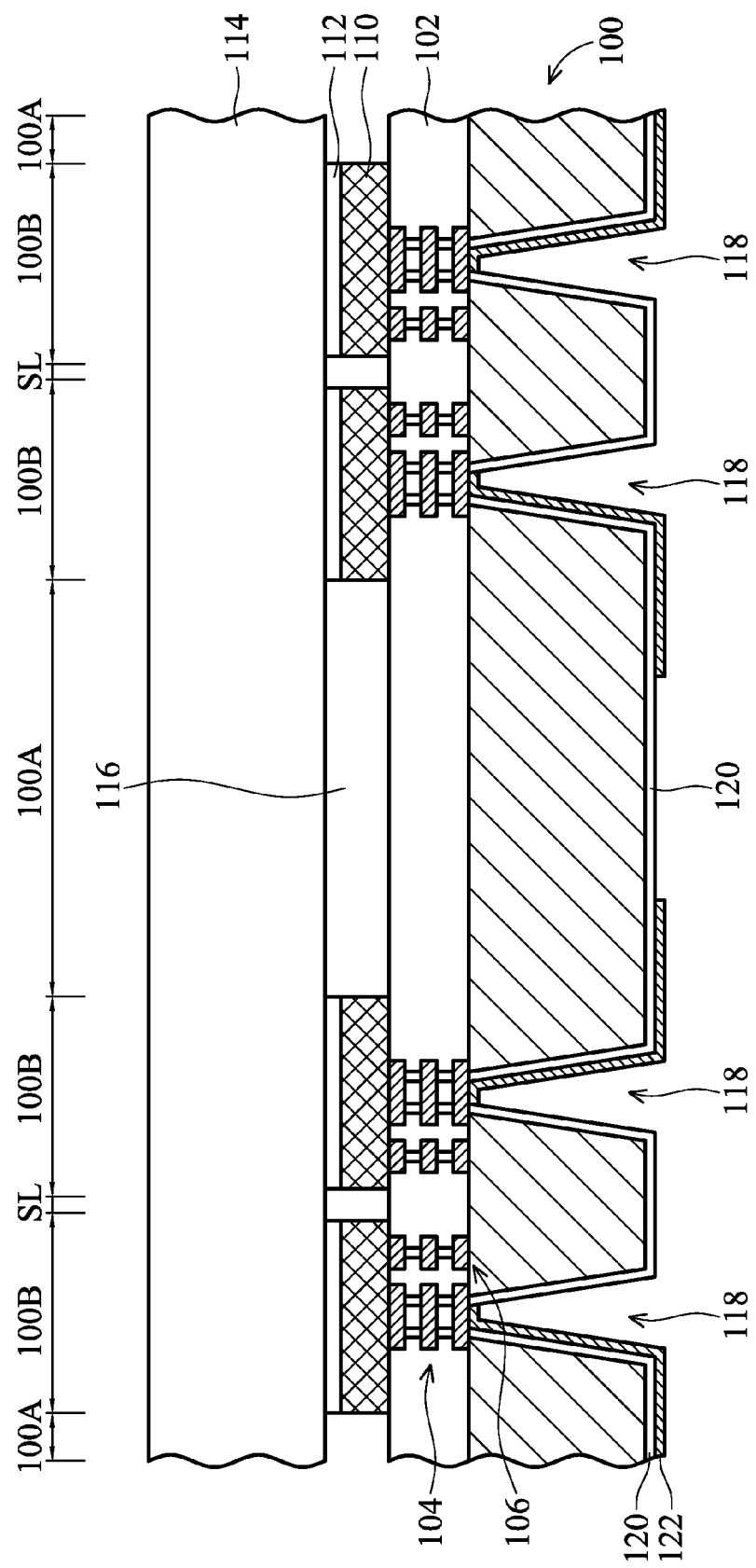

Next, referring to FIG. 1E, a through hole 118 is formed on the backside surface of the semiconductor wafer 100 by a photolithography and etching process to expose the surface of the conductive pad 104. Then, as shown in FIG. 1F, an insulating layer 120 is formed on the backside surface of the semiconductor wafer 100, extending onto the sidewall of the through hole 118. The insulating layer 120 may be a non-photosensitive insulating material, such as silicon oxides, silicon nitrides or silicon oxynitrides. An insulating material can be conformally formed on the backside surface of the semiconductor wafer 100 and on the sidewall and the bottom of the through hole 118 by a thermal oxidation process, a chemical vapor phase deposition (CVD) process or a physical vapor phase deposition (PVD) process. Then, a portion of the insulating material formed on the bottom of the through hole 118 is removed by a photolithography and etching process to form the insulating layer 120 as shown in FIG. 1F.

Next, a conductive trace layer 122 is formed on the insulating layer 120 and extends to the bottom of the through hole 118 for electrically connecting to the conductive pad 104. A conductive material layer (not shown), such as one made of copper (Cu), aluminum (Al) or nickel (Ni), may be formed on the insulating layer 120 and in the through hole 118 by a sputtering process, an evaporating process or an electroplating process. Then, the conductive material layer is patterned by a photolithography and etching process to form the conductive trace layer 122.

Figure 1G:
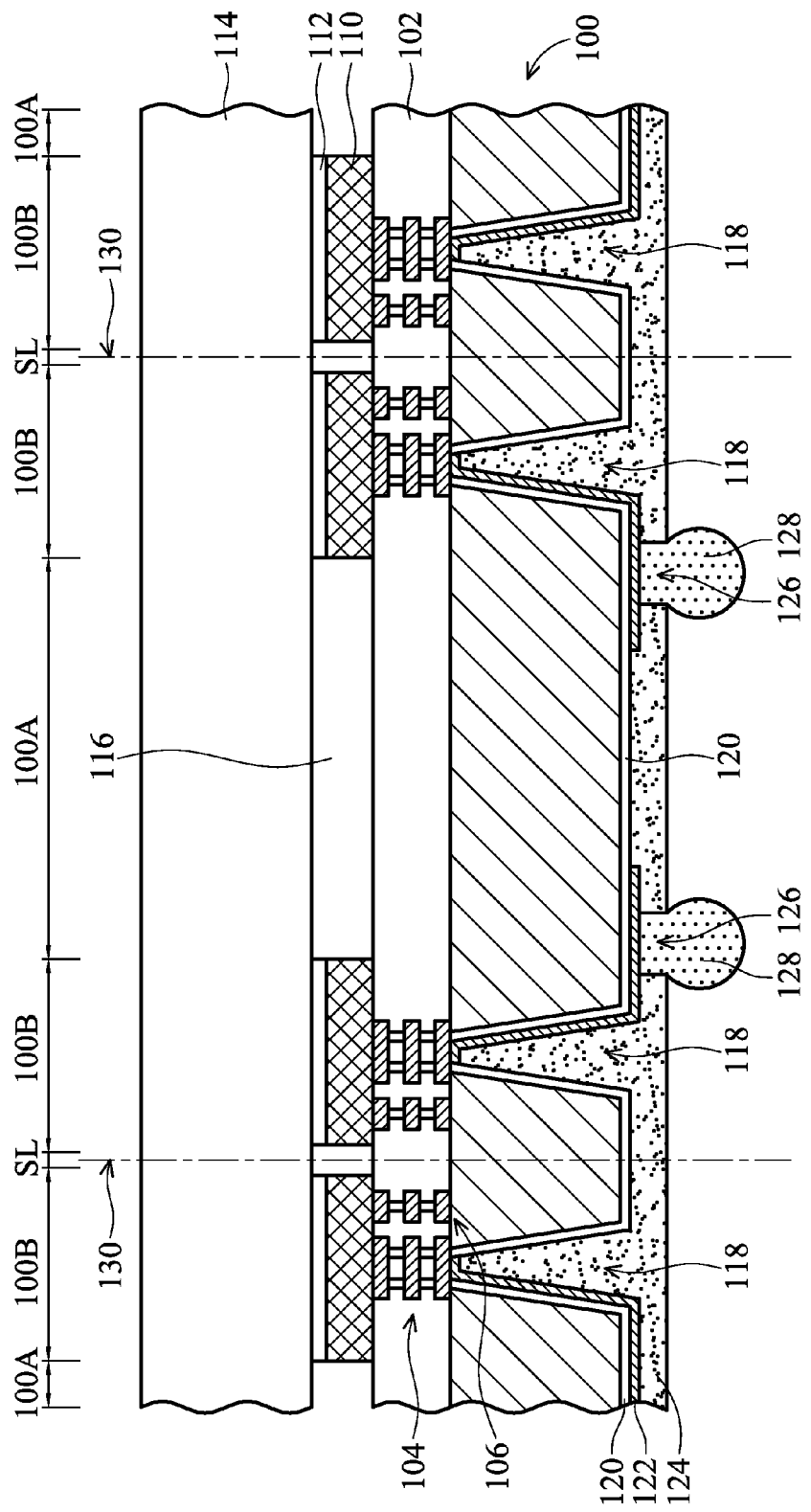

As shown in FIG. 1G, a passivation layer 124, for example a solder mask layer, is formed on the insulating layer 120 and the conductive trace layer 122, covering the conductive trace layer 122. Then, the passivation layer 124 is patterned to form an opening 126 to expose a portion of the conductive trace layer 122. Next, a solder material is coated in the opening 126 of the passivation layer 124 and then a reflow process is performed to form a conductive bump 128. The conductive bump 128 may be a solder ball or a solder paste.

Figure 1H:
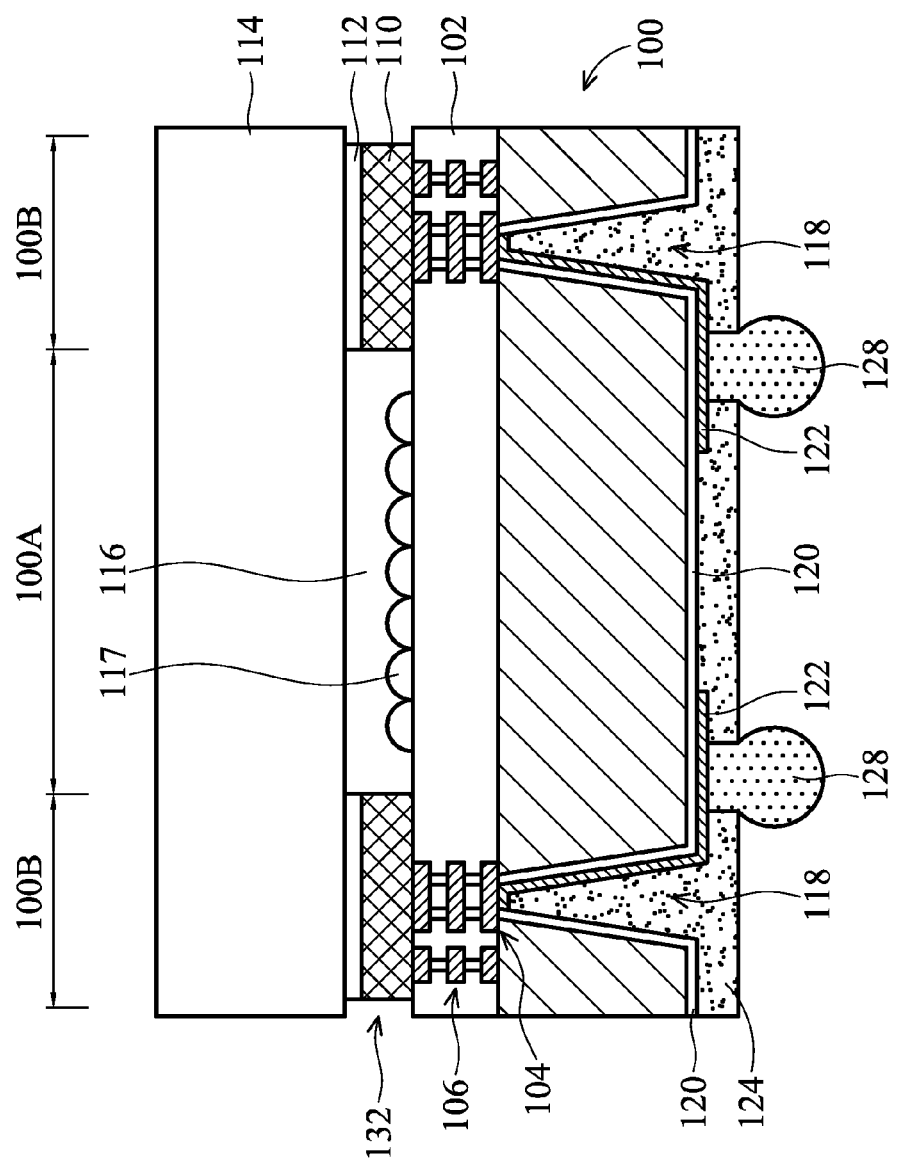

Then, the semiconductor wafer 100 is diced by a cutter (not shown) along a line 130 in the scribe line SL to form a plurality of chip packages as shown in FIG. 1H. It is noted that the width of the cutter is smaller than the width of the scribe line SL.

Referring to FIG. 1H, a cross section of a chip package according to an embodiment of the invention is shown. The chip with semiconductor substrate 100 is, for example formed from dicing a semiconductor wafer. The chip includes the device area 100A and the peripheral bonding pad area 100B in the semiconductor substrate 100, wherein the device area 100A is surrounded by the peripheral bonding pad area 100B.

A plurality of conductive pads 104 and a seal ring 106 are disposed on the peripheral bonding pad area 100B of the semiconductor substrate 100. The conductive pad 104 is for example a bonding pad, which is electrically connected to an inner part of the chip through a metal interconnection (not shown). The seal ring 106 is disposed at the outside of the conductive pads 104, which can prevent cracks produced from the dicing process of the semiconductor wafer from extending to the inner of the chip. The seal ring 106 is not electrically connected to the inner part of the chip.

According to the embodiments of the invention, in the chip packages formed from dicing the semiconductor wafer 100, the side surface consisting of the packaging layer 114, the spacer 110 and the semiconductor substrate 100 has a recess section 132. The recess section 132 is located between the packaging layer 114 and the semiconductor substrate 100, such that the packaging layer 114, the spacer 110 and the semiconductor substrate 100 form a non-continuous side surface.

In an embodiment, from a top view, the recess section 132 surrounds the spacer 110 to form a ring-shaped recess section. Meanwhile, the spacers 110 corresponding to the two adjacent chips are separate from each other. In another embodiment, from a top view, the shape of the spacer 110 corresponding to one chip may be a rectangle and the recess section 132 is disposed at each corner of the rectangle, each side of the rectangle or the combinations thereof. When the recess section 132 is disposed at the corner of the rectangle, an L-typed opening is formed at the corner of the spacer 110. When the recess section 132 is disposed at each side of the rectangle, the spacers 110 corresponding to the two adjacent chips are connected to each other and a rectangle opening is formed between the two adjacent spacers 110.

In an embodiment, the chip packages can be applied in, but is not limited to, the manufacturing of image sensor devices, such as complementary metal oxide semiconductor (CMOS) devices or charge-couple devices (CCD). Moreover, the chip packages can also be applied in the manufacturing of micro electro mechanical system (MEMS) devices.

The conductive pad 104 and the seal ring 106 are preferably formed from copper (Cu), aluminum (Al) or other suitable metal materials. The spacer 110 may be disposed between the packaging layer 114 and the semiconductor substrate 100, such that the cavity 116 is formed between the packaging layer 114 and the semiconductor substrate 100 and the cavity 116 is surrounded by the spacer 110. Moreover, a micro lens array 117 may be further formed on the device area 100A of the semiconductor substrate 100 to assist the image sensor devices in receiving light.

In an embodiment, the packaging layer 114 may be a transparent substrate, for example a glass, an opal, or a plastic substrate or any suitable transparent substrate which can allow light to transmit therethrough. It is noted that, a filter and/or an anti-reflective layer may be selectively formed on the packaging layer 114. In the embodiments applied to the non-photosensitive device chips, the packaging layer 114 may be a semiconductor material layer, for example a silicon capping layer.

In another embodiment, the space between the semiconductor substrate 100 and the packaging layer 114 can be fully filled with the spacer 110, such that no cavity is formed between the semiconductor substrate 100 and the packaging layer 114.

According to embodiments of the invention, the recess section 132 may be formed in the chip packages and disposed between the packaging layer 114 and the semiconductor substrate 100. Therefore, the packaging layer 114, the adhesive layer 112, the spacer 110, and the semiconductor substrate 100 form a non-continuous side surface. The stress produced from the difference between the thermal expansion coefficients of the layers of the packaging layer 114, the adhesive layer 112, the spacer 110 and the semiconductor substrate 100 are reduced by the non-continuous side surface and thereby prevent delamination from occurring in the chip packages.

Therefore, the embodiments of the invention can effectively prevent water vapor and air from permeating into the chip packages, enhancing reliability of the chip packages and decreasing electrical failure of devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a chip having a semiconductor substrate, wherein the semiconductor substrate has at least a conductive pad that is not exposed on a surface of the semiconductor substrate;
    a packaging layer disposed over the semiconductor substrate; and
    a spacer disposed between the semiconductor substrate and the packaging layer, wherein a side surface is defined by the semiconductor substrate, the spacer and the packaging layer, and wherein the side surface has a recess section located at the spacer; and
    a seal ring disposed outside of the conductive pad, wherein the conductive pad and the seal ring overlap with the spacer.

2. The chip package as claimed in claim 1, wherein the recess section surrounds the spacer to form a ring-shaped recess section.

3. The chip package as claimed in claim 1, wherein the spacer has a shape of a rectangle and the recess section is disposed at each corner of the rectangle, each side of the rectangle or combinations thereof.

4. The chip package as claimed in claim 1, wherein the recess section is located between the semiconductor substrate and the packaging layer.

5. The chip package as claimed in claim 4, further comprising:
    a peripheral bonding pad area and a device area, wherein the peripheral bonding pad area surrounds the device area;
    a plurality of conductive pads disposed on the peripheral bonding pad area; and
    the seal ring disposed on the peripheral bonding pad area, surrounding the conductive pads.

6. The chip package as claimed in claim 5, wherein the seal ring is located in an area of the spacer.

7. A chip package, comprising:
    a chip having a semiconductor substrate;
    a packaging layer disposed over the semiconductor substrate;
    a spacer disposed between the semiconductor substrate and the packaging layer, wherein a side surface is defined by the semiconductor substrate, the spacer and the packaging layer, and wherein the side surface has a recess section located at the spacer;
    a peripheral bonding pad area and a device area, wherein the peripheral bonding pad area surrounds the device area;
    a plurality of conductive pads disposed on the peripheral bonding pad area
    a seal ring disposed on the peripheral bonding pad area, surrounding the conductive pads;
    a through hole disposed on a surface of the semiconductor substrate to expose at least one of the plurality of conductive pads;
    an insulating layer disposed on the surface of the semiconductor substrate and extending to a sidewall of the through hole;
    a conductive trace layer disposed on the insulating layer and extending to a bottom of the through hole for electrically connecting to the at least one of the plurality of conductive pads;
    a passivation layer disposed to cover the conductive trace layer and the insulating layer, and having an opening to expose a portion of the conductive trace layer; and
    a conductive bump disposed in the opening of the passivation layer for electrically connecting to the conductive trace layer.

8. The chip package as claimed in claim 1, further comprising a cavity formed between the packaging layer and the chip of the semiconductor substrate, wherein the cavity is surrounded by the spacer.

9. The chip package as claimed in claim 1, wherein the material of the spacer comprises a photosensitive insulating material.

10. The chip device package as claimed in claim 1, further comprising an adhesive layer disposed between the spacer and the semiconductor substrate or between the spacer and the packaging layer.

11. The chip package as claimed in claim 3, wherein the recess section is disposed at each corner of the spacer to form an L-shaped opening at each corner of the spacer.

12. The chip package as claimed in claim 3, wherein the recess section is disposed at each side of the spacer to form a rectangular opening at each side of the spacer.

13. The chip package as claimed in claim 1, wherein the seal ring is disposed between the side surface and the conductive pad, at near a periphery of the substrate.

14. A chip package, comprising:
   a semiconductor substrate including a chip, wherein the semiconductor substrate has at least a conductive pad that is not exposed on a surface of the semiconductor substrate;
   a packaging layer disposed over the semiconductor substrate; and
   a spacer disposed between the semiconductor substrate and the packaging layer, wherein the semiconductor layer, the spacer and the packaging layer define a side surface, and wherein a recess is defined on the side surface at a location between the semiconductor layer and the packaging layer; and
   a seal ring disposed between the side surface and the conductive pad, at near a periphery of the substrate, wherein the conductive pad and the seal ring overlap with the spacer.

15. The chip package as claimed in claim 14, wherein the spacer is shrunk inward from the side surface to form the recess.

* * * * *